United States Patent
Venkatachari

(10) Patent No.: US 12,339,336 B2
(45) Date of Patent: Jun. 24, 2025

(54) SYSTEM AND METHOD TO REDUCE SPECIFIC ABSORPTION RATE IN MAGNETIC RESONANCE IMAGING

(71) Applicant: GE Precision Healthcare LLC, Waukesha, WI (US)

(72) Inventor: Anand Kumar Venkatachari, Brookfield, WI (US)

(73) Assignee: GE Precision Healthcare LLC, Waukesha, WI (US)

( * ) Notice: Subject to any disclaimer, the term of this patent is extended or adjusted under 35 U.S.C. 154(b) by 193 days.

(21) Appl. No.: 18/361,690

(22) Filed: Jul. 28, 2023

(65) Prior Publication Data
US 2025/0035721 A1    Jan. 30, 2025

(51) Int. Cl.
*G01R 33/28* (2006.01)
*G01R 33/561* (2006.01)

(52) U.S. Cl.
CPC ....... *G01R 33/288* (2013.01); *G01R 33/5618* (2013.01)

(58) Field of Classification Search
None
See application file for complete search history.

(56) References Cited

U.S. PATENT DOCUMENTS

| | | | |
|---|---|---|---|
| 5,572,126 A | 11/1996 | Shinnar | |
| 7,791,342 B2 * | 9/2010 | Sauer | G01R 33/441 324/309 |
| 9,581,670 B2 * | 2/2017 | Stemmer | G01R 33/56554 |
| 2006/0061358 A1 | 3/2006 | Hargreaves | |
| 2013/0249548 A1 * | 9/2013 | Stemmer | G01R 33/543 324/309 |
| 2015/0301131 A1 | 10/2015 | Hardy | |
| 2016/0131731 A1 | 5/2016 | Oka | |
| 2019/0064293 A1 | 2/2019 | Zhang | |

* cited by examiner

*Primary Examiner* — Rodney E Fuller

(57) ABSTRACT

A method for imaging a subject using a magnetic resonance imaging (MRI) system includes determining a tailored radio frequency (RF) pulse sequence having a plurality of refocusing pulses. In the method, a target peak RF pulse value is determined and a transfer function to convert a first refocusing pulse of the plurality of refocusing pulses to a modified refocusing pulse with the target peak RF pulse value is also determined. A modified RF pulse sequence is generated based on the transfer function and the plurality of refocusing pulses. Finally, magnetic resonance (MR) signals from the subject are acquired based on the modified RF pulse sequence and the medical image of the subject is generated based on the acquired MR signals.

20 Claims, 5 Drawing Sheets

SYSTEM AND METHOD TO REDUCE SPECIFIC ABSORPTION RATE IN MAGNETIC RESONANCE IMAGING

BACKGROUND

Embodiments disclosed in the present invention relate to magnetic resonance imaging (MRI) systems and methods, and more particularly, to techniques for reducing specific absorption rate (SAR) in MRI technology.

MRI is a widely utilized medical imaging technique that provides detailed anatomical and functional information of the human body. MRI systems use powerful magnetic fields and radio frequency (RF) pulses to generate signals from the body's tissues, enabling the creation of high-resolution images.

However, one of the challenges associated with MRI is the potential for patient exposure to radio frequency energy, resulting in a phenomenon known as Specific Absorption Rate (SAR). SAR is a measure of the rate at which RF energy is absorbed by the patient's body during an MRI scan. Excessive SAR levels can lead to tissue heating and potential adverse effects. Therefore, International Electrotechnical Commission (IEC) has set certain limits for SAR in MRI. For example, the SAR limits are 4 W/kg for the body and 3.2 W/kg for the head for a 6-minute duration.

There are a number of ways to reduce SAR in MRI. One way is to reduce the flip angle, which is the angle by which the protons are tipped in the magnetic field. Another way is to reduce the number of slices that are imaged. Additionally, the SAR can be reduced by using a lower radio frequency power. While these techniques have shown some success in SAR reduction, they often compromise image quality, acquisition time, or diagnostic accuracy.

Therefore, there is a need for an improved approach that effectively reduces SAR without compromising the overall performance of the MRI system.

BRIEF DESCRIPTION

In accordance with an embodiment of the present technique, a method for imaging a subject using a magnetic resonance imaging (MRI) system is provided. The method includes determining a tailored radio frequency (RF) pulse sequence having a plurality of refocusing pulses and determining a target peak RF pulse value. The method also includes determining a transfer function to convert a first refocusing pulse of the plurality of refocusing pulses to a modified refocusing pulse with the target peak RF pulse value and generating a modified RF pulse sequence based on the transfer function and the plurality of refocusing pulses. The method further includes acquiring magnetic resonance (MR) signals from the subject based on the modified RF pulse sequence and generating a medical image of the subject based on the acquired MR signals.

In accordance with another embodiment of the present technique, a magnetic resonance imaging (MRI) system is provided. The MRI system includes a magnet configured to generate a polarizing magnetic field about at least a portion of a subject arranged in the MRI system. A gradient coil assembly is provided in the MRI system which includes a readout gradient coil, a phase gradient coil, a slice selection gradient coil that are configured to apply at least one gradient field to the polarizing magnetic field. The MRI system also includes a radio frequency (RF) system configured to apply an RF field to the subject and to receive magnetic resonance signals from the subject. The MRI system also includes a processing system. The processing system is configured to determine a tailored radio frequency (RF) pulse sequence having a plurality of refocusing pulses and determine a target peak RF pulse value. The processing system is further configured to determine a transfer function to convert a first refocusing pulse of the plurality of refocusing pulses to a modified refocusing pulse with the target peak RF pulse value and generate a modified RF pulse sequence based on the transfer function and the plurality of refocusing pulses. The processing system is also configured to acquire magnetic resonance (MR) signals from the subject based on the modified RF pulse sequence and generate a medical image of the subject based on the acquired MR signals.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments. Furthermore, the terms "circuit" and "circuitry" and "controller" may include either a single component or a plurality of components, which are either active and/or passive and are connected or otherwise coupled together to provide the described function.

In magnetic resonance imaging (MRI), an object or a subject is placed in a magnet. When the object is in the magnetic field generated by the magnet, magnetic moments of nuclei, such as protons, attempt to align with the magnetic field but process about the magnetic field in a random order at the nuclei's Larmor frequency. The magnetic field of the magnet is referred to as B0 and extends in the longitudinal or z direction. In acquiring a MR image, a magnetic field (referred to as an excitation field B1), which is in the x-y plane and near the Larmor frequency, is generated by a radio-frequency (RF) coil and may be used to rotate, or "tip," the net magnetic moment $M_z$ of the nuclei from the z direction to the transverse or x-y plane. A signal, which is referred to as a MR signal, is emitted by the nuclei, after the excitation signal B1 is terminated. To use the MR signals to generate an image of an object, magnetic field gradient pulses ($G_x$, $G_y$, and $G_z$) are used. The gradient pulses are used to scan through the k space, the space of spatial frequencies or inverse of distances. A Fourier relationship exists between the acquired MR signals and an image of the object, and therefore the image of the object can be derived by reconstructing the MR signals. The images of the object may include two dimensional (2D) or three-dimensional (3D) images.

Figure 1:
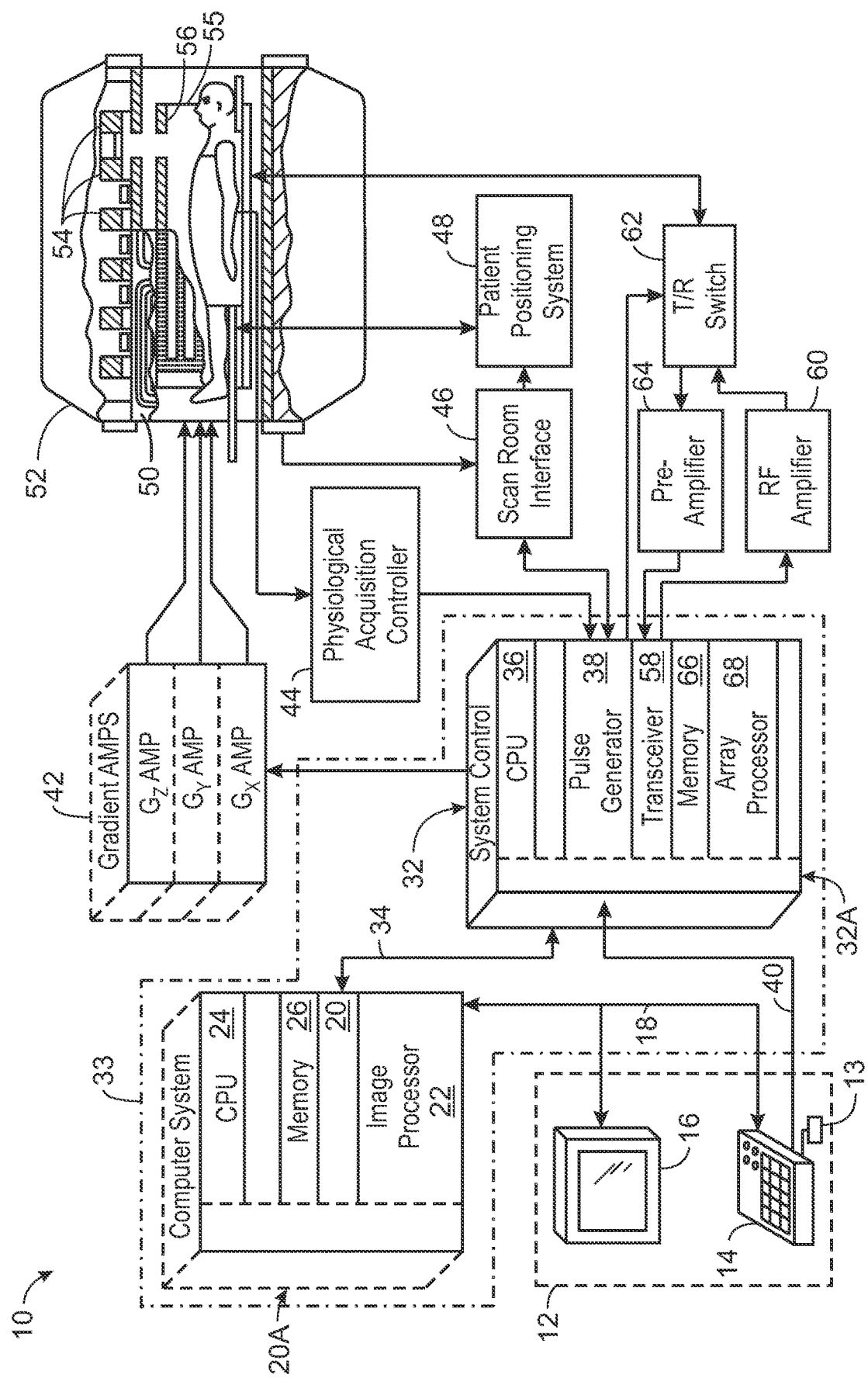
FIG. 1 is a schematic diagram of an exemplary magnetic resonance imaging (MRI) system, in accordance with an embodiment of the present technique.

Embodiments of the present disclosure will now be described, by way of an example, with reference to the figures, in which FIG. 1 is a schematic diagram of a magnetic resonance imaging (MRI) system 10. Operation of the system 10 may be controlled from an operator console 12, which includes an input device 13, a control panel 14, and a display screen 16. The input device 13 may be a mouse, joystick, keyboard, track ball, touch activated screen, light wand, voice control, and/or other input device. The input device 13 may be used for interactive geometry prescription. The console 12 communicates through a link 18 with a computer system 20 that enables an operator to control the production and display of images on the display screen 16. The link 18 may be a wireless or wired connection. The computer system 20 may include modules that communicate with each other through a backplane 20A. The modules of the computer system 20 may include an image processor module 22, a central processing unit (CPU) module 24, and a memory module 26 that may include a frame buffer for storing image data arrays, for example. The computer system 20 may be linked to archival media devices, permanent or back-up memory storage or a network for storage of image data and programs and communicates with MRI system control 32 through a high-speed signal link 34. The MRI system control 32 may be separate from or integral with the computer system 20. The computer system 20 and the MRI system control 32 collectively form an "MRI controller" 33 or "controller".

In the exemplary embodiment, the MRI system control 32 includes modules connected by a backplane 32a. These modules include a CPU module 36 as well as a pulse generator module 38. The CPU module 36 connects to the operator console 12 through a data link 40. The MRI system control 32 receives commands from the operator through the data link 40 to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to components that are operated by the MRI controller 32, including the pulse generator module 38 which controls a gradient amplifier 42, a physiological acquisition controller (PAC) 44, and a scan room interface circuit 46.

In one example, the CPU module 36 receives patient data from the physiological acquisition controller 44, which receives signals from sensors connected to the object, such as ECG signals received from electrodes attached to the patient. As used herein, an object or a subject is a human (or patient), an animal, or a phantom. The CPU module 36 receives, via the scan room interface circuit 46, signals from the sensors associated with the condition of the patient and the magnet system. The scan room interface circuit 46 also enables the MRI controller 33 to command a patient positioning system 48 to move the patient to a desired position for scanning.

A whole-body RF coil 56 is used for transmitting the waveform towards subject anatomy. The whole body-RF coil 56 may be a body coil. An RF coil may also be a local coil that may be placed in more proximity to the subject anatomy than a body coil. The RF coil 56 may also be a surface coil. RF coils containing RF receiver channels may be used for receiving the signals from the subject anatomy. Typical surface coil would have eight receiving channels; however, different number of channels are possible. Using the combination of both a body coil 56 and a surface coil is known to provide better image quality.

The pulse generator module 38 may operate the gradient amplifiers 42 to achieve desired timing and shape of the gradient pulses that are produced during the scan. The gradient waveforms produced by the pulse generator module 38 may be applied to the gradient amplifier system 42 having Gx, Gy, and Gz amplifiers. Each gradient amplifier excites a corresponding physical gradient coil in a gradient coil assembly 50, to produce the magnetic field gradients used for spatially encoding acquired signals. Specifically, Gx corresponds to a flow/frequency encoding gradient, Gy corresponds to a phase encoding gradient and Gz corresponds to a slice select gradient. The gradient coil assembly 50 may form part of a magnet assembly 52, which also includes a polarizing magnet 54 (which, in operation, provides a longitudinal magnetic field $B_0$ throughout a target volume 55 that is enclosed by the magnet assembly 52 and a whole-body RF coil 56 (which, in operation, provides a transverse magnetic field B1 that is generally perpendicular to B0 throughout the target volume 55. A transceiver module 58 in the MRI system control 32 produces pulses that may be amplified by an RF amplifier 60 and coupled to the RF coil 56 by a transmit/receive switch 62. The resulting signals emitted by the excited nuclei in the subject anatomy may be sensed by receiving coils (not shown) and provided to a preamplifier 64 through the transmit/receive switch 62. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the receiving coil during the receive mode.

The MR signals produced from excitation of the target are digitized by the transceiver module 58. The MRI system control 32 then processes the digitized signals by Fourier transform to produce k-space data, which is transferred to a memory module 66, or other computer readable media, via the MRI system control 32. "Computer readable media" may include, for example, structures configured so that electrical, optical, or magnetic states may be fixed in a manner perceptible and reproducible by a conventional computer (e.g., text or images printed to paper or displayed on a screen, optical discs, or other optical storage media, "flash" memory, EEPROM, SDRAM, or other electrical storage media; floppy or other magnetic discs, magnetic tape, or other magnetic storage media).

A scan is complete when an array of raw k-space data has been acquired in the computer readable media 66. This raw k-space data is rearranged into separate k-space data arrays for each image to be reconstructed, and each of these k-space data arrays is input to an array processor 68, which operates to reconstruct the data into an array of image data, using a reconstruction algorithm such as a Fourier transform. When the full k-space data is obtained, it represents entire volume of the subject body and the k-space so obtained may be referred as the reference k-space. Similarly, when only the partial k-space data is obtained, the image may be referred as the partial k-space. This image data is conveyed through the data link 34 to the computer system 20 and stored in memory. In response to the commands received from the operator console 12, this image data may be archived in a long-term storage or may be further processed by the image processor 22 and conveyed to the operator console 12 and presented on the display 16.

MR signals are represented by complex numbers, where each location at the k-space is represented by a complex number, with I and Q quadrature MR signals being the real and imaginary components. Complex MR images may be reconstructed based on I and Q quadrature MR signals, using processes such as Fourier transform of the k-space MR data. Complex MR images are MR images with each pixel represented by a complex number, which also has a real component and an imaginary component. The magnitude M of the received MR signal may be determined as the square root of the sum of the squares of the I and Q quadrature components of the received MR signal as in Eq. (3) below:

$$M = \sqrt{I^2 + Q^2} \quad (1)$$

and the phase $\phi$ of the received MR signal may also be determined as in eq. (2) below:

$$\phi = \tan^{-1}\left(\frac{Q}{I}\right) \quad (2)$$

Since Radio Frequency (RF) are used in the MR imaging, a small energy is absorbed by body tissues of the patient. The measure of the rate at which the energy is absorbed by the human body is referred to as Specific Absorption Rate (SAR) typically expressed in units of watts per kilogram (W/kg). Regulatory bodies, such as the United States (US) Food and Drug Administration (FDA) and the International Electrotechnical Commission (IEC), have established SAR limits to ensure that exposure to RF energy during an MRI scan remains within safe levels.

The two-dimensional (2D) Fast Spin Echo (FSE) pulse sequence is a widely used technique in magnetic resonance (MR) imaging. The 2D FSE can generate multiple contrasts, allowing for the visualization of various tissue properties. These contrasts include T1, T2, T1 FLAIR (Fluid Attenuated Inversion Recovery), T2 FLAIR, STIR (Short Tau Inversion Recovery) to name a few.

In general, in MRI, the pulse sequence refers to the specific timing and order of RF pulses and gradient fields used to scan the patient or the subject. By applying specific combinations of RF pulses and gradients to the RF coil and the gradient coil respectively, the 2D FSE pulse sequence can selectively manipulate the magnetization of different tissues, resulting in the generation of these various contrasts. However, because 2D FSE uses a train of RF pulses, this pulse sequence is SAR intensive for the patient. To reduce SAR, in one embodiment, FSE with Tailored RF pulses may be used. The tailored RF pulses use different RF pulse shapes and peaks (representing B1) and the flip angle for refocusing pulses compared to the 2D FSE. As will be appreciated by those skilled in the art, the refocusing pulses are RF pulses applied after excitation RF pulse to overcome the dephasing. In another embodiment, a Variable Rate Selective Excitation (VERSE) technique can also be used to reduce the RF power. The VERSE technique reduces the peak B1 value of the RF pulses by a certain scaling factor and the gradient waveform is reshaped based on the scaling factor to excite the same slice.

In the present technique, a modified RF pulse sequence algorithm to reduce SAR is proposed. The modified RF pulse sequence algorithm generates a transfer function to convert the tailored RF pulses and gradient waveforms in the FSE technique to low power RF and Gradient segments. The transfer function will be generated for Excitation and the Refocusing pulse with a B1 value lower than a defined B1 value. The transfer function for the first Refocusing pulse with the defined B1 value will be applied to all the other subsequent refocusing pulses of different shapes of the tailored RF pulses. By applying the same transfer function to all the different Refocusing pulse shapes the pulse width of all the Refocusing pulses will be same.

Figure 2:
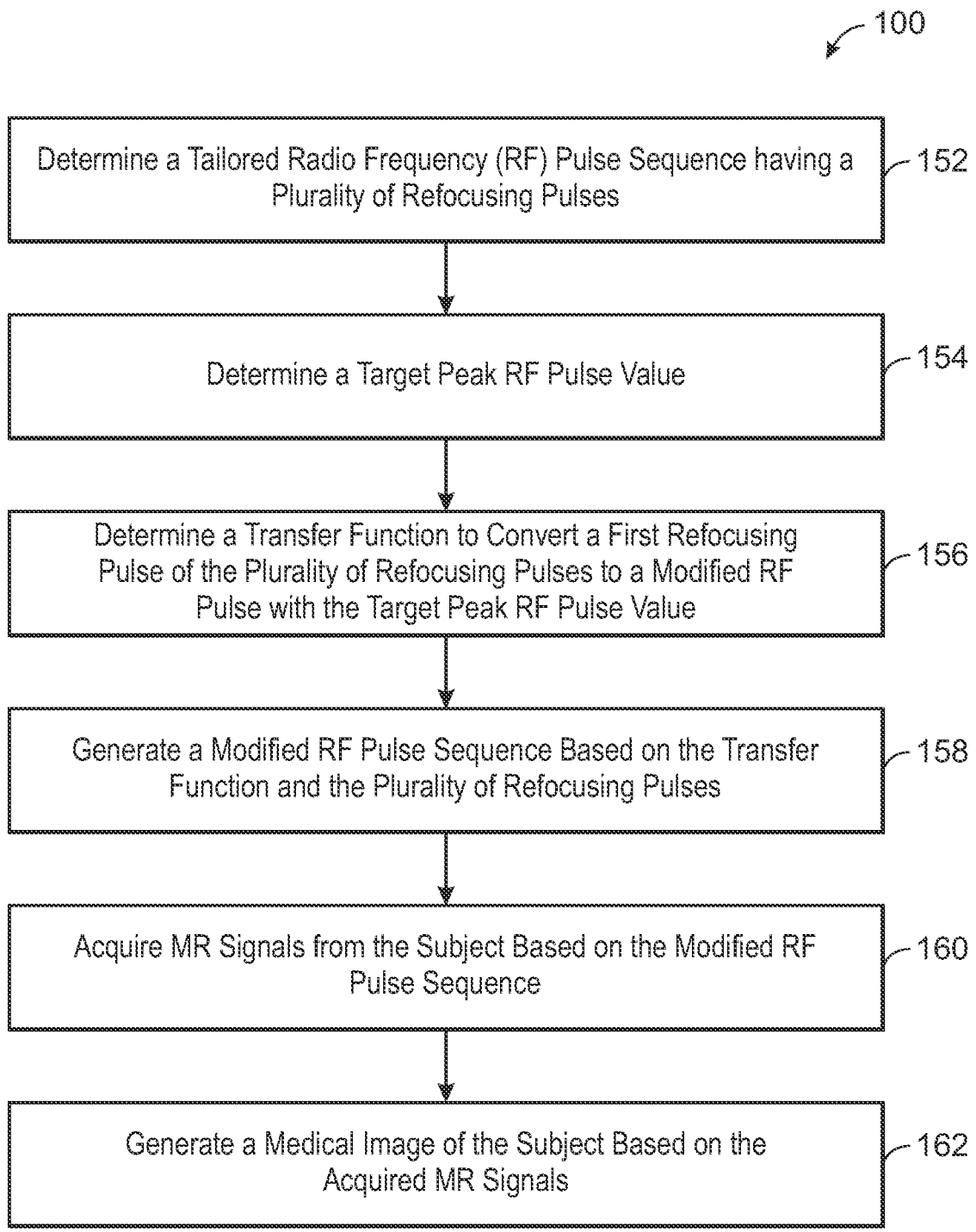
FIG. 2 is a flow chart of an exemplary method that may be implemented in system of FIG. 1 in accordance with an embodiment of the present technique.

FIG. 2 is a flow chart 150 of an exemplary method 150 for reducing SAR in MRI imaging. The method 150 may be implemented in the MRI controller 33 of FIG. 1. In one or more embodiments, the MRI controller is a special-purpose element configured to perform operations not performable by a general-purpose computer or device. Software embodying these processes may be stored by any non-transitory tangible medium including a fixed disk, a floppy disk, a CD, a DVD, a Flash drive, or a magnetic tape. In the exemplary embodiment, the method includes determining a tailored radio frequency (RF) pulse sequence having a plurality of refocusing pulses at step 152.

In one embodiment, determining the tailored RF pulse sequence may include designing the tailored RF pulse to reduce specific absorption rate (SAR) for the patient under scan. This tailoring process results in different parameters such as a variable shape, a variable pulse amplitude and/or a variable flip angle for the subsequent refocusing pulses that are applied after an excitation pulse. Using Tailored RF pulses for refocusing pulses helps to reduce the SAR compared to using single shaped RF pulses. Typically, the first refocusing Tailored RF pulse has higher B1 and optimum slice profile. The following RF pulses can have lower B1 and compromised slice profile. Combining these pulses together gives overall good management of SAR and image quality. For example, a first refocusing pulse after the excitation pulse may be designed to be more intense in the center of the slice, while the second pulse may be designed to be more intense at the middle of edges of the slice and the third refocusing pulse may be designed to be more intense at the outer edges of the slice. This design may reduce local SAR in specific regions of interest. Other refocusing pulses may be designed in the similar manner i.e., the peak of the pulse may be adjusted according to the portion of the slice that is being focused upon. Moreover, variable flip angle sequences can redistribute the RF energy deposition across the echo train. For example, if the initial refocusing pulses have lower flip angles then it leads to lower SAR during the early part of the echo train when the echoes are weaker. As the echo train progresses, the flip angle is increased, and SAR levels are also adjusted accordingly.

In one embodiment, the factors on which the shape of the refocusing pulses depends include bandwidth of the refocusing pulse, slice width, and the strength of the gradient waveform. In general, the shape of the RF pulse determines the shape of the excited slice. Thus, depending on which area of the slice needs to be excited, the RF pulse may be tailored. In a tailored RF pulse sequence, the RF pulses are stretched in time, which means that the excited slice is also stretched in time. This requires the gradient waveform to be changed accordingly. In on embodiment, the gradient waveform may be stretched in time by the same factor as the RF pulse.

Figure 3:
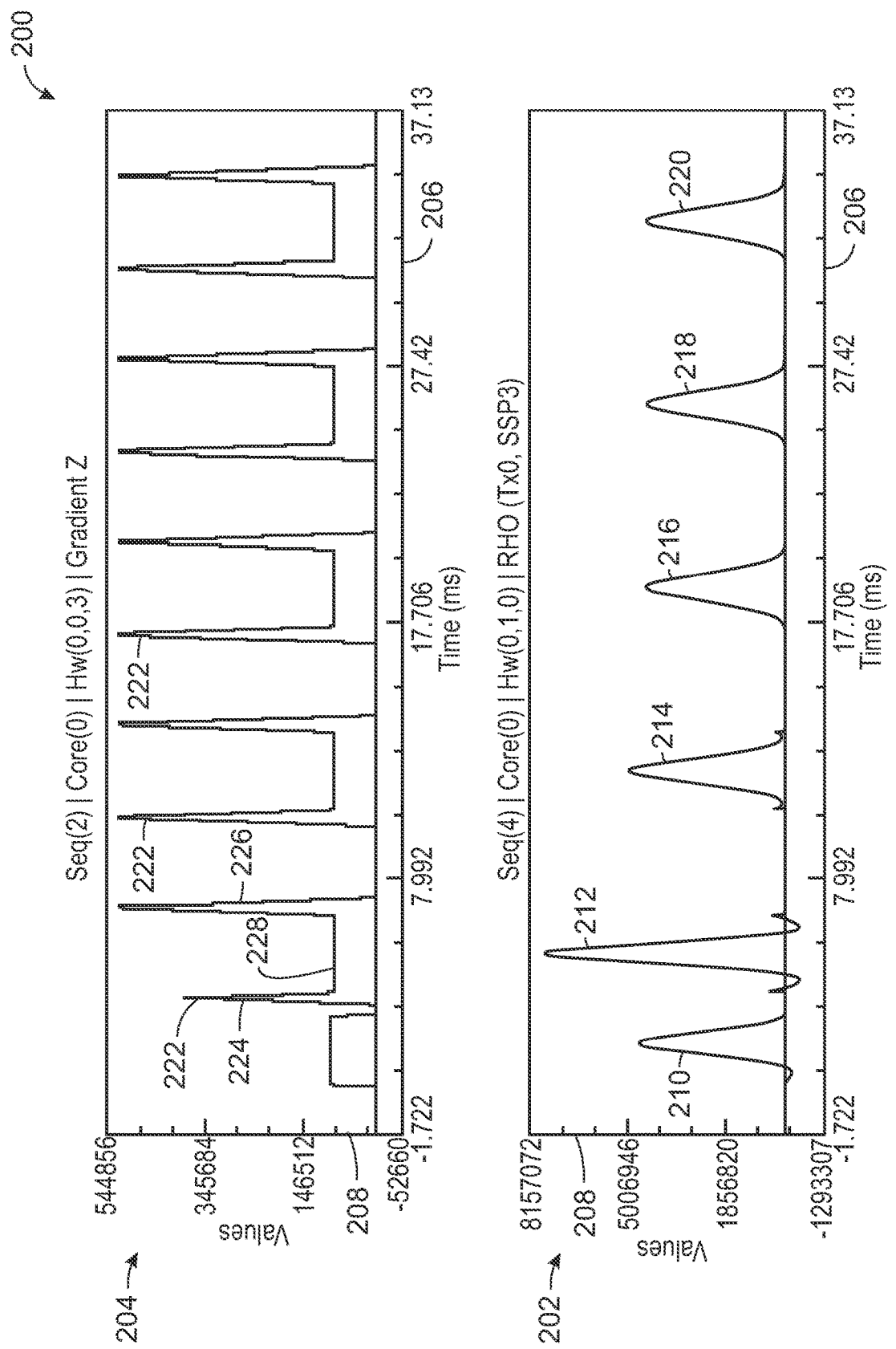
FIG. 3 is a graphical representation of plots of a tailored RF pulse sequence and corresponding slice gradient pulses in accordance with an embodiment of the present technique.

FIG. 3 shows a graphical representation 200 of plots of a tailored RF pulse sequence 202 and corresponding slice gradient pulses 204. The tailored RF pulse sequence is basically fast spin echo (FSE) with tailored RF pulse sequence. In both plots 202 and 204, a horizontal axis 206 represents time and a vertical axis 208 represents amplitude of the corresponding plot.

As can be seen from plot 202, there is a 90° RF excitation pulse 210, followed by a plurality of RF refocusing pulses 212, 214, 216, 218, 220 that have variable parameters with respect to each other at least for the first three pulses 212, 214, 216. As discussed earlier the variable parameter such as the amplitude, the shape or the flip angle of each of the refocusing pulse is tailored depending on which area of the slice needs to be excited or depending on weighting of different contrasts. Thus, it can be seen that refocusing pulse 212 has a different shape compared to the shape of the refocusing pulses 214-220 and same is the case for remaining refocusing pulses. It should be noted that different shapes refer to different pulse amplitudes ($B1_{peak}$) and/or different flip angles or time periods of the pulse. For example, refocusing pulses 212, 214 and 216 have flip angle equal to 120.775°, 109.959°, 111.212° respectively and their amplitude is also different as can be seen from plot 202. Further, from plot 204, it can be seen that the shape of the slice gradient pulses 222 is also changed as per the shapes of the refocusing pulses. Each of the gradient pulses 222 have lobes 224, 226 on either side of the pulse. These lobes are known as crusher gradients, and act to dephase spurious signal coming from outside the slice of interest. The amplitude of the crusher gradient, the time duration and the amplitude of the off-crusher gradient pulse 228 may be changed according to the shapes of the refocusing pulses. The gradient amplitude depends on the slice thickness, Bandwidth (BW) of the RF pulse. In one embodiment, the amplitude of slice selective gradient (G) can be determined by the equation: BW=$\gamma$*G*Slice Thickness, where $\gamma$ is a gyromagnetic ratio.

Referring back to FIG. 2, at step 154, the method includes determining a target peak RF pulse value ($B1_{target\_peak}$). The target peak RF pulse value $B1_{target\_peak}$ basically represents desired peak amplitude of the refocusing RF pulse. In one embodiment, the target peak RF pulse value is determined based on acceptable peak specific absorption rate value ($SAR_{peak}$). In one embodiment, the $B1_{target\_peak}$ value is given as:

$$B1_{target\_peak} \sim \sqrt{\frac{(2\rho * SAR_{peak})}{\sigma A^2 \omega^2 D}} \quad (1)$$

where A is the patient body tissue area, $\rho$ is the tissue mass, D is the duty cycle of RF pulse, $\omega$ is the RF pulse frequency and $\sigma$ is the electrical conductivity of tissue. It should be noted that there are multiple other ways to determine $B1_{target\_peak}$ based on $SAR_{peak}$ and equation (1) is just one example. Moreover, a relationship between flip angle ($\alpha$) and RF pulse amplitude B1 may be given as:

$$\alpha \sim \gamma \cdot B1/D \quad (2)$$

where $\gamma$ is a gyromagnetic ratio of a particle which is a constant (e.g., $\gamma$=42.58 MHz/T for hydrogen). Thus, in an embodiment, based on the $B1_{target\_peak}$ and D a corresponding flip angle $\alpha_{target\_peak}$ may also be determined.

At step 156, the method includes determining a transfer function (TF) to convert the first refocusing pulse 212 having peak amplitude of $B1_{peak}$ to a modified RF pulse with the target peak RF pulse value $B1_{target\_peak}$. In one embodiment, such a transfer function can be determined by first determining area under curve (AUC) of the original refocusing pulse 212 and then determining the modified pulse which has same AUC but which as the amplitude equal to $B1_{target\_peak}$. In another embodiment, the transfer function may be determined based on amplitude modulation algorithms such as Piecewise Linear Modulation, polynomial modulation or optimal control theory. Further, in one embodiment, the transfer function may be determined based on a relationship between B1 and gradient pulse amplitude and a relationship between B1, D and SAR. In this embodiment, the algorithm may combine the values of gradient pulse amplitude and pulse width of the RF refocusing pulse as well as the gradient pulse to determine what values of RF pulse and the gradient pulse achieve the desired outcome of restricting the value of B1 to the target $B1_{target\_peak}$ and other image parameters (e.g., image contrast).

In yet another embodiment, such a transfer function is simply a ratio of ($B1_{target\_peak}/B1_{peak}$). Based on the transfer function, the duty cycle D of the modified RF pulse ($D_m$) may be determined. For example, if in equation 1 it is assumed that A, $\rho$, $\omega$ and $\sigma$ are constants then the D of the modified RF pulse $D_m$ may be determined as:

$$D_m = \frac{(2\rho * SAR_{peak})}{\sigma A^2 \omega^2 TF^2 * B1_{peak}^2} \quad (3)$$

where TF=$B1_{target\_peak}/B1_{peak}$. Based on the $D_m$ and $B1_{target\_peak}$, flip angle $\alpha_m$ for the modified RF pulse may be determined as:

$$\alpha_m \sim \gamma \cdot B1_{target\_peak}/D_m \quad (4)$$

Thus, at step 158, the method 100 includes generating a modified RF pulse sequence based on the transfer function and the plurality of refocusing pulses. Specifically, to generate the modified RF pulse sequence, the same transfer function TF determined for first refocusing pulse 212 is used to for the remaining refocusing pulses 214-220 and gradient pulse 222. This is possible because the first refocusing RF pulse 212 has the maximum Peak B1 compared to the following refocusing pulses 214-220. Thus, if the B1 value of the refocusing RF pulse 212 is restricted to the target B1 value (B1$_{target\_peak}$) then automatically the B1 values for remaining refocusing pulses will be lower than the target B1 value (B1$_{target\_peak}$). In other words the first refocusing pulse 212 contributes to maximum SAR as compared to other refocusing pulses. It should be noted that because the transfer function being used for all the refocusing pulses is same, the pulse width D$_m$ also remains same for all the refocusing pulses.

The modified pulse sequence generated at step 158 is applied to the MR system at step 160 to acquire MR signals from the subject. Once the MR signals are obtained, at step 162, a medical image of the subject is generated based on the MR using some reconstruction techniques as explained earlier.

Figure 4:
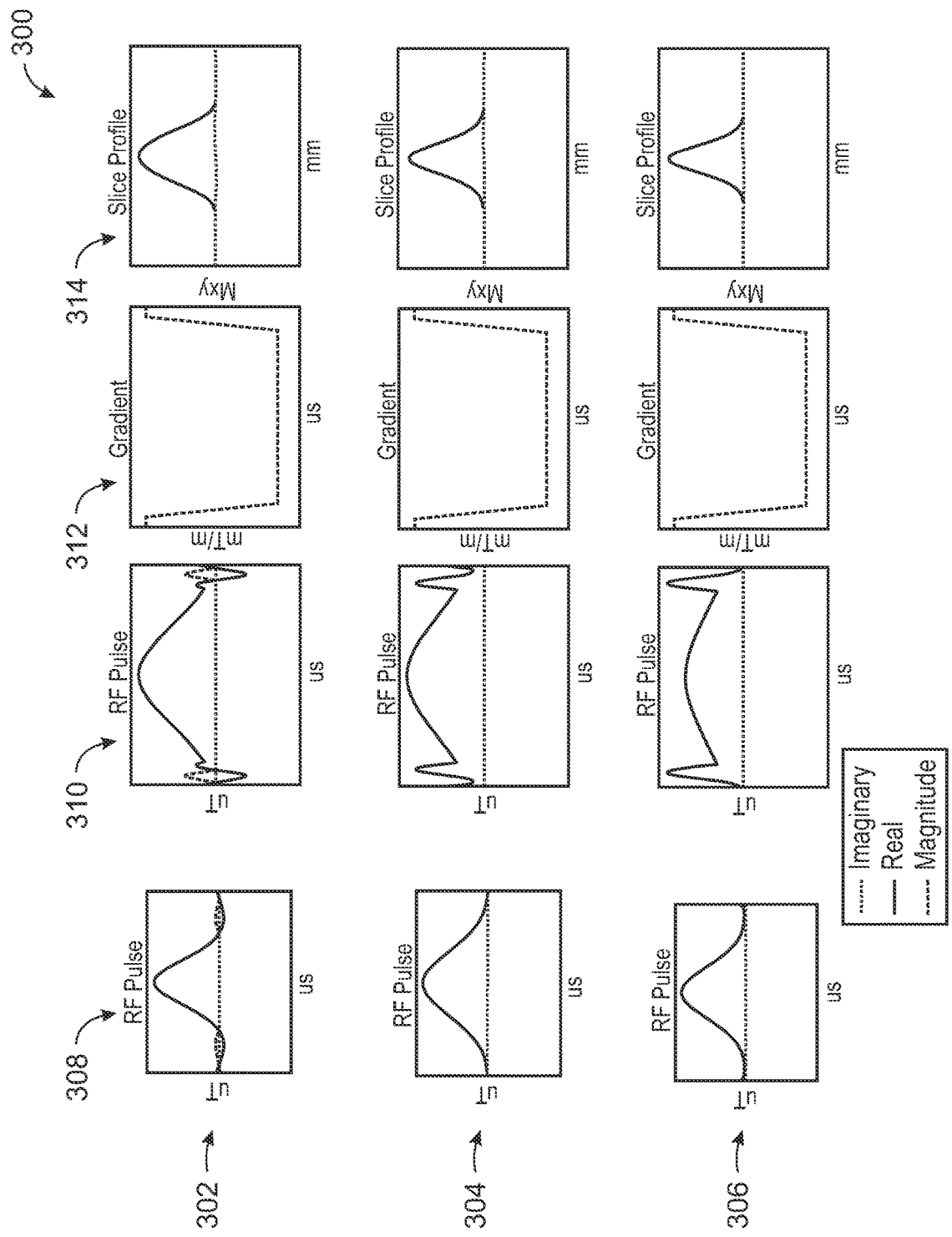
FIG. 4 is a graphical representation of the application of transfer function to the refocusing pulses and the corresponding slice gradient pulses in accordance with an embodiment of the present technique.

FIG. 4 shows a graphical representation 300 of application of transfer function to the refocusing pulses and the corresponding slice gradient pulses. Specifically, in FIG. 4 rows 302, 304 and 306 correspond to refocusing pulses 212, 214 and 216 of FIG. 3. A first column 308 shows the refocusing pulses, column 310 shows a plurality of modified refocusing pulses after the application of the transfer function to the refocusing pulses in column 308. Column 312 represents modified gradient pulses corresponding to the modified refocusing pulses in column 310 and column 314 represents corresponding slice profile plots. As will be appreciated by those skilled in the art, slice profile plots shows magnetization of spin in the corresponding slice.

It should be noted that each of the plots in columns rows 302, 304 and 306 may show three curves representing magnitude, real component and imaginary component of that respective plot. Moreover, the same transfer function that is applied to the refocusing pulse 212 in row 302 is applied to the rest of the refocusing pulses 214 and 216 in rows 304, 306 and corresponding gradient pulses. As is shown in Fig. a plot 406 of FIG. 5, the pulses shown in column 310 are applied one after another in sequence in the modified RF pulse sequence after the application of the 90° RF excitation pulse. Same is the case for the slice gradient pulses in column 312 i.e., these pulses are applied one after another in sequence as shown in plot 406 of FIG. 5. Moreover, these modified gradient pulses are generated after applying the transfer function to the gradient pulses 222 in FIG. 3. As will be appreciated by those skilled in the art, application of the transfer function to refocusing pulse or the gradient pulse means modifying the parameters of the refocusing pulse and the gradient pulse based on the transfer function as shown in equations 3 and 4.

Figure 5:
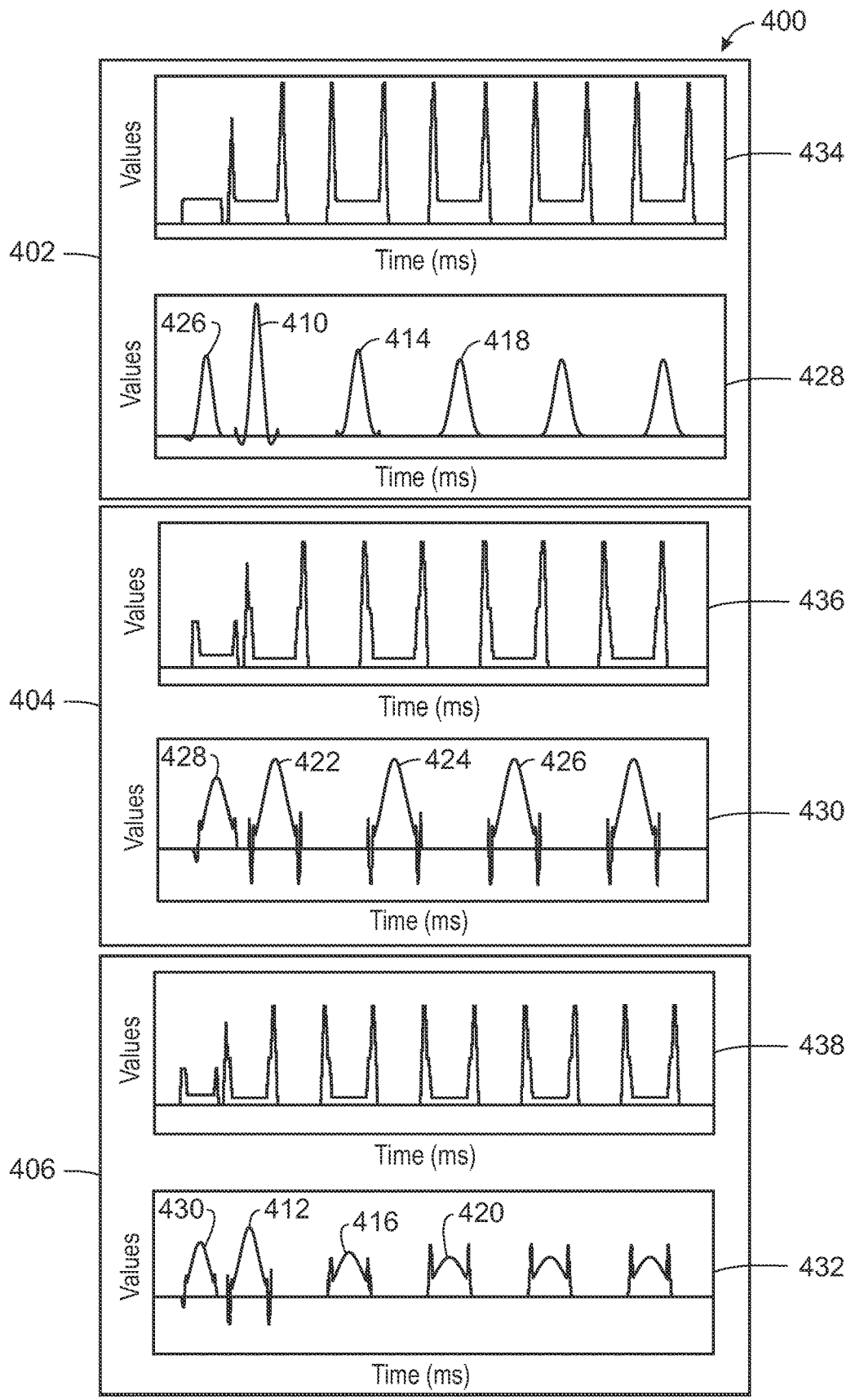
FIG. 5 is graphical representation of a comparison of three RF pulse sequences.

FIG. 5 shows a graphical representation 400 of comparison of three RF pulse sequences. Specifically, plot 402 in FIG. 5 shows a tailored RF pulse sequence as pulse sequence 202 of FIG. 3 that is used to reduce SAR in the subject. Plot 404 is a basic variable rate selective excitation (VERSE) pulse sequence. As explained earlier, in the basic VERSE pulse sequence, the peak B1 value of the FSE pulse sequence which uses a similar shape pulse (i.e., same amplitude) for all refocusing pulses is reduced by a certain scaling factor to reduce SAR. Further, plot 406 shows a modified RF pulse sequence obtained after the application of the transfer function on the tailored RF pulse sequence 402 as explained in preceding paragraphs with respect to FIG. 4. In all the plots 402, 404 and 406, the lower portions 428, 430, 432 show pulse sequence waveforms whereas the upper portions 434, 436, 438 show corresponding slice gradient waveforms. As can be seen in plots 402 and 406, the amplitude of first (410, 412), second (414, 416) and third (418, 420) refocusing pulses is different but the amplitude of first (422), second (424) and third (426) refocusing pulses of plot 404 is same. Plots 402, 404 and 406 also show a 90° RF excitation pulses 426, 428 and 430 respectively. The modified excitation pulse 430 is generated after the application of the transfer function to the excitation pulse 426. Similarly, gradient waveform 438 is applied after the application of the transfer function to the gradient waveform 434.

A table 1 below compares the simulated SAR values for each of the pulse sequences 428, 430 and 432. As can be seen from the table the flip angles for the first, second and third refocusing pulses is same for all pulse sequences i.e., 120.775°, 109.959° and 111.212° respectively. As can be further seen from the table the SAR value for the tailored RF pulse sequence 428 is 2.52 W/kg; SAR value for the VERSE RF pulse sequence 430 is 1.89 W/kg and the SAR value for the modified RF pulse sequence 432 is 1.15 W/kg. Thus, the modified RF pulse sequence presented herein has the least amount of SAR compared to the tailored RF pulse sequence and the VERSE RF pulse sequence.

TABLE 1

| Pulse Sequence (PS) | 1st refocusing pulse flip angle (RPFA) | $2^{nd}$ RPFA | $3^{rd}$ RPFA | SAR |
| --- | --- | --- | --- | --- |
| Tailored RF PS | 120.775 | 109.959 | 111.212 | 2.52 |
| VERSE RF PS | 120.775 | 109.959 | 111.212 | 1.89 |
| Modified RF PS | 120.775 | 109.959 | 111.212 | 1.15 |

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for imaging a subject using a magnetic resonance imaging (MRI) system comprising:
   determine a tailored radio frequency (RF) pulse sequence having a plurality of refocusing pulses;
   determine a target peak RF pulse value;
   determine a transfer function to convert a first refocusing pulse of the plurality of refocusing pulses to a modified refocusing pulse with the target peak RF pulse value;
   generate a modified RF pulse sequence based on the transfer function and the plurality of refocusing pulses;
   acquire magnetic resonance (MR) signals from the subject based on the modified RF pulse sequence; and
   generate a medical image of the subject based on the acquired MR signals.

2. The method of claim 1, wherein the plurality of refocusing pulses have variable parameters which includes at least one of a variable pulse amplitude or a variable flip angle or a variable shape.

3. The method of claim 2, wherein the variable parameters are determined based on a specific absorption rate value.

4. The method of claim 1, wherein the tailored RF pulse sequence includes a 90° RF excitation pulse applied before the plurality of refocusing pulses.

5. The method of claim 1, wherein the same transfer function is applied to each of the plurality of refocusing pulses to generate modified RF pulse sequence, wherein the modified RF pulse sequence includes a modified excitation pulse followed by a plurality of modified refocusing pulses.

6. The method of claim 5, wherein a pulse width of each of the plurality of modified refocusing pulses is same.

7. The method of claim 1, wherein the transfer function is applied to gradient pulses of the tailored RF pulse sequence to generate modified gradient pulses for the modified RF pulse sequence.

8. The method of claim 1, wherein the target peak RF pulse value is determined based on a peak specific absorption rate value.

9. The method of claim 1, wherein the transfer function is determined based on an area under curve of the first refocusing pulse and the target peak RF pulse value.

10. The method of claim 1, wherein the transfer function is determined based on a ratio of the target peak RF pulse value and an amplitude of the first refocusing pulse.

11. A magnetic resonance imaging (MRI) system, comprising:
a magnet configured to generate a polarizing magnetic field about at least a portion of a subject arranged in the MRI system;
a gradient coil assembly including a readout gradient coil, a phase gradient coil, a slice selection gradient coil configured to apply at least one gradient field to the polarizing magnetic field;
a radio frequency (RF) system configured to apply an RF field to the subject and to receive magnetic resonance signals from the subject;
a processing system programmed to:
determine a tailored radio frequency (RF) pulse sequence having a plurality of refocusing pulses;
determine a target peak RF pulse value;
determine a transfer function to convert a first refocusing pulse of the plurality of refocusing pulses to a modified refocusing pulse with the target peak RF pulse value;
generate a modified RF pulse sequence based on the transfer function and the plurality of refocusing pulses;
acquire magnetic resonance (MR) signals from the subject based on the modified RF pulse sequence; and
generate a medical image of the subject based on the acquired MR signals.

12. The MRI system of claim 11, wherein the plurality of refocusing pulses have variable parameters which include at least one of a variable pulse amplitude or a variable flip angle or a variable shape.

13. The MRI system of claim 12, wherein the processing system is programmed to determine the variable parameters based on a specific absorption rate value.

14. The MRI system of claim 11, wherein the tailored RF pulse sequence includes a 90° RF excitation pulse applied before the plurality of refocusing pulses.

15. The MRI system of claim 11, wherein the processing system is programmed to apply the same transfer function to each of the plurality of refocusing pulses to generate modified RF pulse sequence, wherein the modified RF pulse sequence include a modified excitation pulse followed by a plurality of modified refocusing pulses.

16. The MRI system of claim 15, wherein a pulse width of each of the plurality of modified refocusing pulses is same.

17. The MRI system of claim 11, wherein the processing system is programmed to apply the transfer function to gradient pulses of the tailored RF pulse sequence to generate modified gradient pulses for the modified RF pulse sequence.

18. The MRI system of claim 11, wherein the processing system is programmed to determine the target peak RF pulse value based on a peak specific absorption rate value.

19. The MRI system of claim 11, wherein the processing system is programmed to determine the transfer function based on an area under curve of the first refocusing pulse and the target peak RF pulse value.

20. The MRI system of claim 11, wherein the processing system is programmed to determine the transfer function based on a ratio of the target peak RF pulse value and an amplitude of the first refocusing pulse.

* * * * *